United States Patent
Gupta et al.

(10) Patent No.: US 9,019,007 B2
(45) Date of Patent: Apr. 28, 2015

(54) HIGH LINEARITY VARIABLE CAPACITOR ARRAY

(71) Applicant: Newlans, Inc., Acton, MA (US)

(72) Inventors: Dev V. Gupta, Acton, MA (US); Zhiguo Lai, Acton, MA (US)

(73) Assignee: Newlans, Inc., Acton, MA (US)

( * ) Notice: Subject to any disclaimer, the term of this patent is extended or adjusted under 35 U.S.C. 154(b) by 9 days.

(21) Appl. No.: 14/014,496

(22) Filed: Aug. 30, 2013

(65) Prior Publication Data

US 2014/0355172 A1    Dec. 4, 2014

Related U.S. Application Data

(60) Provisional application No. 61/857,446, filed on Jul. 23, 2013, provisional application No. 61/828,107, filed on May 28, 2013.

(51) Int. Cl.
*H03B 1/00*    (2006.01)
*H03K 5/00*    (2006.01)
(Continued)

(52) U.S. Cl.
CPC ......... *H01F 17/0013* (2013.01); *H03H 7/0138* (2013.01); *H03H 7/38* (2013.01); *H01G 5/38* (2013.01); *H01G 4/38* (2013.01); *H01L 23/642* (2013.01); *H01L 27/0811* (2013.01); *H03H 5/003* (2013.01); *H03H 7/01* (2013.01); *H03H 7/0153* (2013.01); *H03H 7/48* (2013.01); *H03H 11/1291* (2013.01); *H01F 2017/0026* (2013.01); *H03H 2210/025* (2013.01);
(Continued)

(58) Field of Classification Search
CPC ............ H01G 7/00; H01G 7/06; H01G 5/00; H03H 2210/025; H03H 21/0007; H03J 2200/39; H01L 28/40
USPC ................. 327/536, 553, 554, 564, 565, 493, 327/503–505, 427, 419; 361/277, 281, 280, 361/278; 307/109
See application file for complete search history.

(56) References Cited

U.S. PATENT DOCUMENTS

| | | |
|---|---|---|
| 4,878,151 A | 10/1989 | Gallichio |
| 5,208,597 A | 5/1993 | Early et al. |

(Continued)

FOREIGN PATENT DOCUMENTS

| | | |
|---|---|---|
| EP | 0581702 A1 | 2/1994 |
| JP | S63 308366 A | 12/1988 |

(Continued)

OTHER PUBLICATIONS

Kampe, A et al., "An LC-VCO with one octave tuning range," IEEE European Conference on Circuit Theory and Design, vol. 3, Aug. 29, 2005, pp. 321-324.

(Continued)

*Primary Examiner* — Lincoln Donovan
*Assistant Examiner* — Thomas Skibinski
(74) *Attorney, Agent, or Firm* — Knobbe, Martens, Olson & Bear, LLP (57) ABSTRACT

A highly linear, variable capacitor array constructed from multiple cells. Each cell includes a pair of passive, capacitor components connected in anti-parallel. The capacitor components may be Metal Oxide Semiconductor (MOS) capacitors. A control circuit applies bias voltages to bias voltage terminals associated with each capacitor component, to thereby control the overall capacitance of the array.

20 Claims, 7 Drawing Sheets (51) Int. Cl.

| | | |
|---|---|---|
| *H01G 5/00* | (2006.01) | |
| *H01G 7/00* | (2006.01) | |
| *H01F 17/00* | (2006.01) | |
| *H03H 7/01* | (2006.01) | |
| *H03H 7/38* | (2006.01) | |
| *H01G 5/38* | (2006.01) | |
| *H01G 4/38* | (2006.01) | |
| *H01L 23/64* | (2006.01) | |
| *H01L 27/08* | (2006.01) | |
| *H03H 5/00* | (2006.01) | |
| *H03H 7/48* | (2006.01) | |
| *H03H 11/12* | (2006.01) | |
| *H01L 49/02* | (2006.01) | |

(52) U.S. Cl.
CPC ..... *H03H 2210/036* (2013.01); *H03H 2240/00* (2013.01); *H01L 28/10* (2013.01)

(56) References Cited

U.S. PATENT DOCUMENTS

| 5,452,178 | A | 9/1995 | Emesh et al. | |
|---|---|---|---|---|
| 6,211,745 | B1 | 4/2001 | Mucke et al. | |
| 6,222,221 | B1* | 4/2001 | Hou et al. | 257/307 |
| 6,351,020 | B1* | 2/2002 | Tarabbia et al. | 257/532 |
| 6,410,954 | B1 | 6/2002 | Sowlati et al. | |
| 6,657,509 | B1 | 12/2003 | Ohannes | |
| 6,765,778 | B1 | 7/2004 | Du et al. | |
| 6,885,081 | B2* | 4/2005 | Morimoto | 257/532 |
| 7,000,000 | B1 | 2/2006 | O'Brien | |
| 7,245,519 | B2 | 7/2007 | McQuirk et al. | |
| 7,251,121 | B2 | 7/2007 | Bhutta | |
| 7,280,001 | B2 | 10/2007 | Maligeorgos et al. | |
| 7,408,422 | B2* | 8/2008 | Dedieu et al. | 331/177 V |
| 7,453,136 | B2 | 11/2008 | Hakkarainen et al. | |
| 8,134,222 | B2 | 3/2012 | Khan et al. | |
| 8,324,069 | B1 | 12/2012 | Carns et al. | |
| 8,395,880 | B2 | 3/2013 | Wasson | |
| 8,531,862 | B2* | 9/2013 | Roest et al. | 365/145 |
| 2004/0066244 | A1 | 4/2004 | Takinami et al. | |
| 2005/0184812 | A1 | 8/2005 | Cho | |
| 2008/0048236 | A1* | 2/2008 | Kim | 257/312 |
| 2009/0096507 | A1* | 4/2009 | Gao et al. | 327/534 |
| 2009/0128992 | A1 | 5/2009 | Haralabiois et al. | |
| 2009/0243743 | A1 | 10/2009 | Kossel et al. | |
| 2010/0052778 | A1 | 3/2010 | Baranauskas et al. | |
| 2011/0002080 | A1* | 1/2011 | Ranta | 361/277 |
| 2011/0109380 | A1 | 5/2011 | Park et al. | |
| 2012/0211868 | A1* | 8/2012 | Stribley et al. | 257/532 |
| 2014/0354348 | A1* | 12/2014 | Gupta et al. | 327/535 |

FOREIGN PATENT DOCUMENTS

| JP | 2006128468 A | 5/2006 |
|---|---|---|
| WO | WO 2013/028546 A1 | 2/2013 |

OTHER PUBLICATIONS

Nakamura, T et al., "A Low-Phase-Noise Low-Power 27-GHz SiGe-VCO using Merged-Transformer Matching Circuit Technique," IEEE Radio Frequency Integrated Circuits Symposium, Jun. 2007, pp. 413-416.

PCT Search Report of Jun. 5, 2014, for International Application No. PCT/US2014/018673, filed Feb. 26, 2014. 18 pages.

Sauerbrey J., et al., "A 0.7-V MOSFET-Only Switched-Opamp Sigmadelta Modulator in Standard Digital CMOS Technology", IEEE Journal of Solid-State Circuits, vol. 37, No. 12, Dec. 2002, pp. 1662-1669.

Ming-Jer Chen et al: "A Novel Cross-Coupled Inter-Poly-Oxide Capacitor for Mixed-Mode CMOS Processes", IEEE Electron Device Letters, vol. 20, No. 7, Jul. 1999.

Han Q et al: "Perturbation Analysis and Experimental Verification of Intermodulation and Harmonic Distortion for an Anti-Series Varactor Pair", IEICE Transactions on Electronics, vol. E88-C, No. 1, Jan. 2005, pp. 89-97.

Pietro Andreani et al: "On the Use of MOS Varactors in RF VCO's", IEEE Journal of Solid-State Circuits, vol. 35, No. 6, Jun. 2000, pp. 905-910.

Invitation to Pay Additional Fees with Communication Relating to the Results of the Partial International Search mailed Aug. 12, 2014 in counterpart International Application No. PCT/US2014/039599 in 10 pages.

International Search Report and Written Opinion dated Nov. 13, 2014 for International Application No. PCT/US2014/039599, filed on May 27, 2014. 25 pages

Zhiqiang et al., "A Multi-Band RF CMOS LC Bandpass Filter with Continuous Frequency Tuning Design." 2010 International Conference on Computer Application and System Modeling (ICCASM 2010). 4 pages.

* cited by examiner

FIG.1A

Total capacitance $= C_{T1}$ at $V_1 =$
$= [C_1 + \Delta C_1] + [C_1 - \Delta C_1] = 2C_1$

FIG.1B

Total capacitance $= C_{T2}$ at $V_2 =$
$= [C_2 + \Delta C_2] + [C_2 - \Delta C_2] = 2C_2$

- CAPACITANCE  2.97 pF TO 9.64 pF
- RATIO  1 : 3.2
- WORD LENGTH  10 BITS => 1,024 STEPS
- STEP SIZE  6.6 fF

HIGH LINEARITY VARIABLE CAPACITOR ARRAY

CROSS REFERENCE TO RELATED APPLICATIONS

This application claims the benefit of the filing dates of two .S. Provisional patent applications entitled "Tunable Passive Filter Components", Ser. No. 61/828,107 filed May 28, 2013, and "Signal Handling Apparatus for Radio Frequency Circuits", Ser. No. 61/857,446 filed Jul. 23, 2013, the entire contents of each of which are hereby incorporated by reference.

BACKGROUND

1. Technical Field

This patent application relates to capacitors, and in particular to a highly linear, variable capacitor implemented from an array of semiconductor capacitor cells.

2. Background Information

A capacitor is a two-terminal, passive electrical component used to store energy in an electric field. Capacitors may take many different physical forms, but in general will contain at least two electrical conductors separated by a dielectric (insulator). When a potential difference (voltage) applied across the conductors, a static electric field develops across the dielectric, causing positive charge to collect on one conductor and negative charge on the other conductor. Energy is thereby stored in the resulting electrostatic field. A capacitor is most often characterized by a single constant value, the capacitance, which is the ratio of the electric charge on each conductor to the potential difference between them. Other parameters, such as quality factor (Q), frequency response, and/or linearity, are also important in selecting an appropriate capacitor design.

Capacitors are commonly used in many different types of alternating current (AC) circuits, and especially radio frequency (RF) circuits. Capacitors are combined with inductors and other components to implement filters, duplexers, resonators, tuners, and other functions in these circuits. Electronic devices such as smart phones, tablets, laptop computers, and the like are now typically expected to use many different radio communication protocols and operate over a wide variety of frequencies, while at the same time being as small and inexpensive as possible. Resonator design, and hence capacitor design, becomes a critical aspect of achieving these goals.

SUMMARY

Problem Description

To meet the requirements for many electronic devices, the front end filters, duplexers, and similar components should be actively configurable. As but one example, the most recent digital wireless protocols, such as Long Term Evolution (LTE), for which smart phones are expected to operate require an ability to select many different operating frequencies.

This requirement makes it difficult to comply with the linearity specifications needed to accurately transmit and receive RF signals while also filtered out interfering signals.

Other designs for configurable filters and duplexers are based on Micro-Electrical Mechanical Systems (MEMS) technologies. However MEMS-based circuit designs typically exhibit poor quality factor, poor reliability and limited tunability.

Approaches such as coupled resonators suffer from large size and limited tenability, and thus are also unsuitable for application in portable wireless devices.

Thus, mixed signal front ends remain at least one area where alternative IC technologies such as gallium arsenide (GaAs) still present an attractive option to the more common silicon technologies.

Summary of Preferred Solution(s)

The above-mentioned and other related problems motivate the present invention, which is a highly linear, configurable, semiconductor capacitor.

The capacitor is provided by a capacitor array that consists of two or more capacitance cells. Each cell is coupled between the first and second terminals and at least one of the control signal inputs. Each cell consists of a pair of passive, capacitor components. Each capacitor component, which may be a Metal Oxide Semiconductor (MOS) capacitor, has an anode and a cathode and has a capacitance that is further controlled by an input bias voltage. The pair of capacitor components in each cell are connected in anti-parallel configuration, such that an anode of a first capacitor is connected to a cathode of the second capacitor and such that an anode of the second capacitor is connected to a cathode of the first capacitor. A control circuit receives one or more control inputs and effects a change in the overall capacitance provided by the array. This change is typically effected by selecting one of multiple possible capacitances for the cell by effecting changes in the corresponding bias voltage input.

In preferred configurations, the bias voltages are selected such that the capacitor components operate in a range where the variance of capacitance in response to two or more predetermined bias voltages is relatively small. This decrease in variation provides lesser susceptibility to the presence of differences in the applied RF signals. This arrangement also permits the control signals to be digital logic signals that have two states; a given state of a control signal selects a corresponding one of the bias voltage settings in each cell.

The cells may be laid out in a hierarchy such a ladder and such that the control inputs activate either one bias level or the other for each element in the array. The capacitance size of the adjacent cells in the ladder can be increased by a predetermined factor, such as two, for each step of the ladder. This arrangement permits selecting a total capacitance for the array by applying a multiple-bit digital control word as an input.

Multiple arrays may be fabricated in a single semiconductor package, sharing common control inputs but different signal inputs.

A number of advantages are provided by this configuration, including high quality factor and high linearity.

Suitable applications for the capacitor array are programmable filters, antenna tuners, network matching tuners, phase shifters, phase locked loops, duplexers and other circuit functions.

BRIEF DESCRIPTION OF THE DRAWINGS

The detailed description below refers to the accompanying drawings, of which.

DETAILED DESCRIPTION OF AN ILLUSTRATIVE EMBODIMENT

Briefly, the preferred design for a vector capacitor discussed herein is constructed from multiple capacitance cells. Each capacitance cell is coupled between first and second signal terminals of the vector capacitor. Each capacitance cell further includes a pair of passive, capacitor components, with each capacitor component having an anode terminal and a cathode terminal and a bias voltage input terminal. The pair of capacitors in each cell is connected in anti-parallel, such that an anode of a first capacitor is connected to a cathode of a second capacitor, and an anode of the second capacitor is connected to a cathode of the first capacitor. A control circuit applies bias voltages to the bias voltage input terminals, to thereby control the overall capacitance of the array.

We turn now to a discussion of the preferred configuration for the capacitor array. One might preferably consider constructing the capacitors in silicon; a Deep Sub-Micron Complimentary Metal Oxide Semiconductor (DSM-CMOS) Integrated Circuit (IC) technology is one possibility. A DSM-CMOS technology embodiment preferred here can provide a quite satisfactory programmable capacitance structure in a very small form factor.

A typical problem presented by most MOS capacitor designs is that they induce non-linearities. In practical implementations for radio frequency signal processing, such capacitors will typically exhibit an alternating current (AC) effects that varies in magnitude with the signal applied. To minimize this effect, the vector capacitor structure preferred here is constructed from an array of N capacitor cells, each of size C. A capacitance ratio of more than 3:1 can be achieved, with programmability provided through the use of a digital word to select the capacitance value. By operating the MOS junctions of the capacitor elements in each particular range, the non-linearity effects can also be reduced.

Figure 1A:
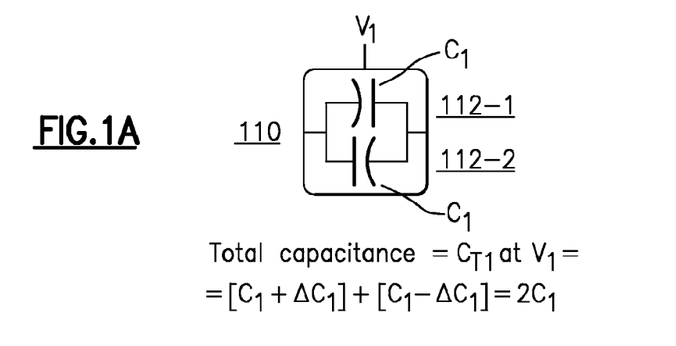
FIG. 1A illustrates a capacitor cell having two capacitor elements connected in an anti-parallel configuration and controlled by a first bias voltage $V_1$; to provide a first total capacitance $2C_1$.

FIG. 1A illustrates one arrangement for an example capacitive cell 110 in the vector capacitor array. A pair of CMOS (Complimentary Metal Oxide Semiconductor) capacitor structures 112-1, 112-2 are provided. Although not shown here in detail, each semiconductor capacitor structure may be physically formed in any suitable way. For example, a capacitor structure fabricated in DSM-CMOS can include a conductive layer disposed on a gate oxide, which is in turn disposed over a base semiconductor substrate. The substrate may have one or more diffusions contacting an N-well or P-well that overlies a P-substrate or N-substrate region. The resulting capacitor has an anode provided by the gate terminal, i.e., the terminal connected to the conductive layer overlaid on the gate oxide; the diffusion(s) form the cathode (e.g., source-drain).

The two capacitors 112-1, 112-2 that make up each cell 110 are connected in an anti-parallel configuration such that the polarity a given terminal of one capacitor is connected to the reverse polarity terminal of the other capacitor. In other words, the anode of the first capacitor is connected to the cathode of the second capacitor, and the anode of the second capacitor is connected to the cathode of the first capacitor.

Figure 1B:
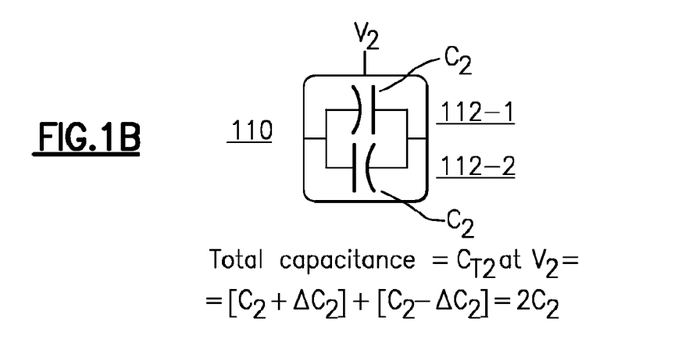
FIG. 1B illustrates the capacitor cell biased at a second voltage $V_2$; to provide a second total capacitance $2C_2$.

The total capacitance of the array is controlled by adjusting the capacitance of each cell, such as by changing an applied bias voltage. For example, application of a bias voltage $V_1$ provides a total capacitance of $2C_1$ as shown in FIG. 1A; application of a bias voltage $V_2$ provides a total capacitance of $2C_2$ as shown in FIG. 1B.

Figure 2:
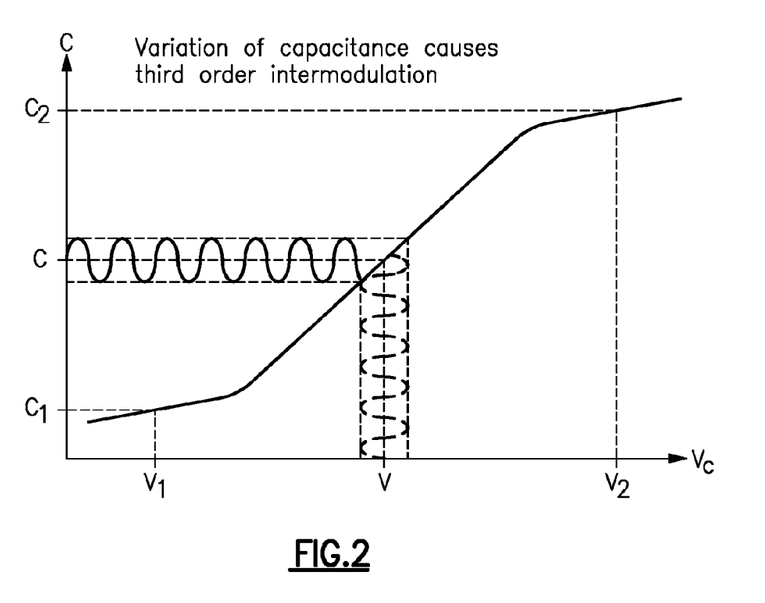
FIG. 2 illustrates a typical capacitance versus applied bias voltage for a Metal Oxide Semiconductor (MOS) capacitor.

More specifically, an MOS capacitor element provides a capacitance, C, depending upon an applied bias voltage Vc. FIG. 2 illustrates an example curve of resulting capacitance, C, versus the applied bias voltage, Vc. Most MOS capacitors are designed such that the bias voltage Vc is within a range such that the semiconductor junction operates in an area of the curve providing capacitance that increases generally linearly with applied voltage. However in a case where an analog voltage Vc varies about a stated voltage V in this region, the resulting capacitance C thus also varies. This can cause a problem with adverse linearity effects if the capacitor array is to be used in an application where varying RF signals are expected to be received by the capacitor.

However, in the embodiments preferred here, one also selectively chooses the bias voltages for each capacitor element 110. More particularly, the bias voltage is selected to be in a range of $V_1$ or $V_2$, typically occurring in the opposite outer ranges of the capacitance curve, where the capacitance variation with voltage is quite a bit smaller. These outer operating ranges are known as the inversion and accumulation modes for the MOS capacitor.

While this restricts the overall available capacitance provided from each single MOS capacitor, the decrease in variation provide lesser variation in the presence of RF signals. This is evident by comparing the output sinusoid at V in FIG. 2 with the reduced amplitude sinusoids produced at $V_1$ and/or $V_2$ in FIG. 3.

If the capacitance values of each element of the anti-parallel capacitor pair 112-1, 112-2 is the same, the total capacitance of the pair can be expressed as follows:

$$\text{total capacitance } C_{T1} \text{ at } V_1 = [C_1 + \Delta C_1] + [C_1 - \Delta C_1] = 2C_1$$

and likewise $$\text{total capacitance } C_{T2} \text{ at } V_2 = [C_2 + \Delta C_2] + [C_2 - \Delta C_2] = 2C_2$$

Figure 3:
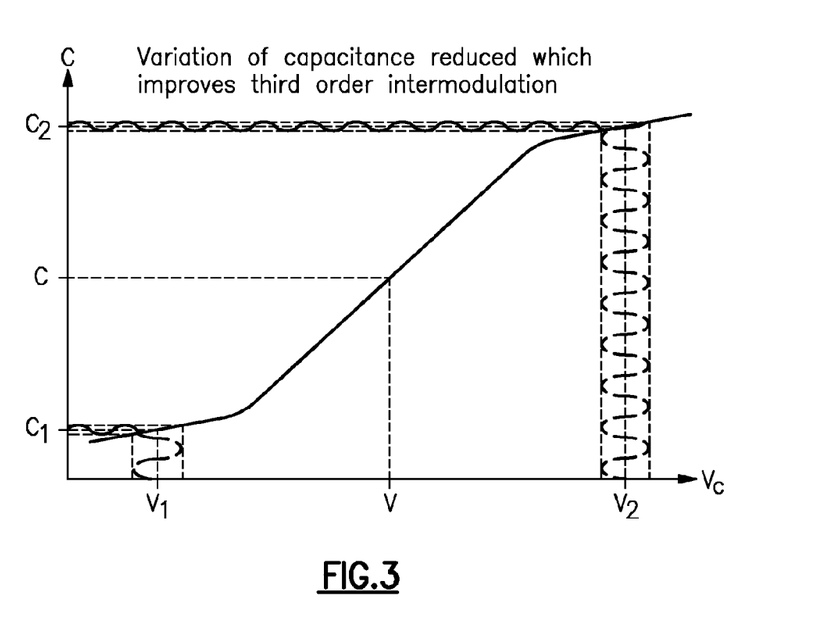
FIG. 3 shows the preferred operating voltage range(s) for $V_1$ and $V_2$ of the capacitor element of FIGS. 1A and 1B.

Thus the effect of any different in capacitance, $\Delta C$, as a result of the slope of the bias curve of FIG. 3 is cancelled as result of the anti-parallel configuration.

Figure 4:
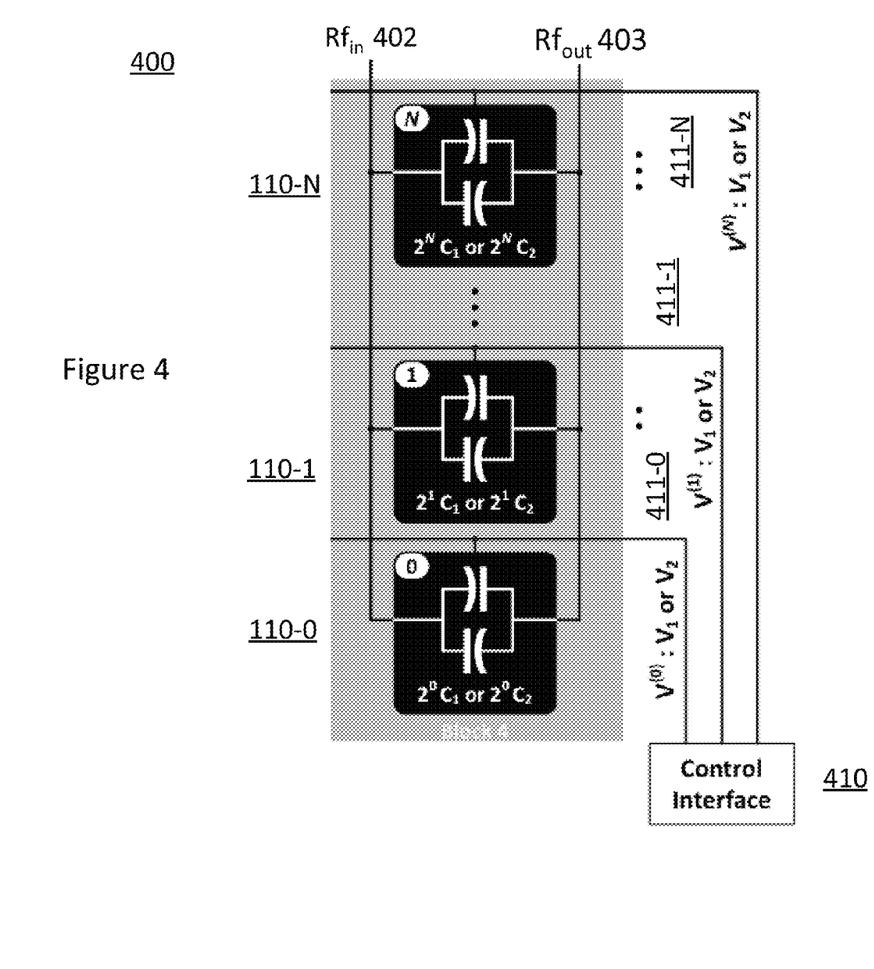
FIG. 4 shows a capacitor array made up of a number, N, of capacitor cells controlled via N input control signals.

FIG. 4 shows an example array 400 consisting of a number (N+1) of such capacitor elements 110-0, 110-1, . . . , 110-N arranged in a ladder (or other hierarchy). A given capacitor element 110 in the ladder provides a selectable amount of capacitance depending upon its corresponding applied bias voltage. That is, a bias voltage, $V_1$ or $V_2$, is applied to each capacitor element independent of the bias voltage applied to the other elements. The bias voltage in turn depends upon the value of a corresponding one of N+1 input control signals V{0} through V{N}. The array 400 is provided with an RF input ($Rf_{in}$ 402) and an RF output ($Rf_{out}$ 403).

The input control signals are provided through a control interface 410, and may be digital signals 411-0, 411-1, . . . , 411-N, that select either one bias voltage, $V_1$ or the other $V_2$, to be applied at a given time to any given capacitor element at any given time.

The scale of the capacitors at each step of the ladder is different from that of its neighboring steps. For example, the capacitor element 110-0 at the bottom of the ladder may be $C_1$ or $C_2$ depending on its applied bias voltage $V_1$ or $V_2$. The next capacitor element 110-1 (one up from the bottom) of the ladder may scaled to be $2C_1$ or $2C_2$ depending on its applied bias voltage $V_1$ or $V_2$. The next capacitor element 110-2 on the ladder may select $4C_1$ or $4C_2$, and so on as a power of 2 progression, so that the N+1 capacitor element in the ladder provides $NC_1$ or $NC_2$.

In an example implementation where N=9, a capacitor element 110-9 thus provides a selectable capacitance of $512C_1$ or $512C_2$ depending on the value of input $V\{9\}$, element 110-8 provides an a capacitance of $256C_1$ or $256C_2$ depending on the value of input $V\{8\}$, and so on down to element 110-0 which provides an output capacitance of $1\ C_1$ or $1\ C_2$ depending on the value of input $V\{0\}$.

Figures 5A, 5B:
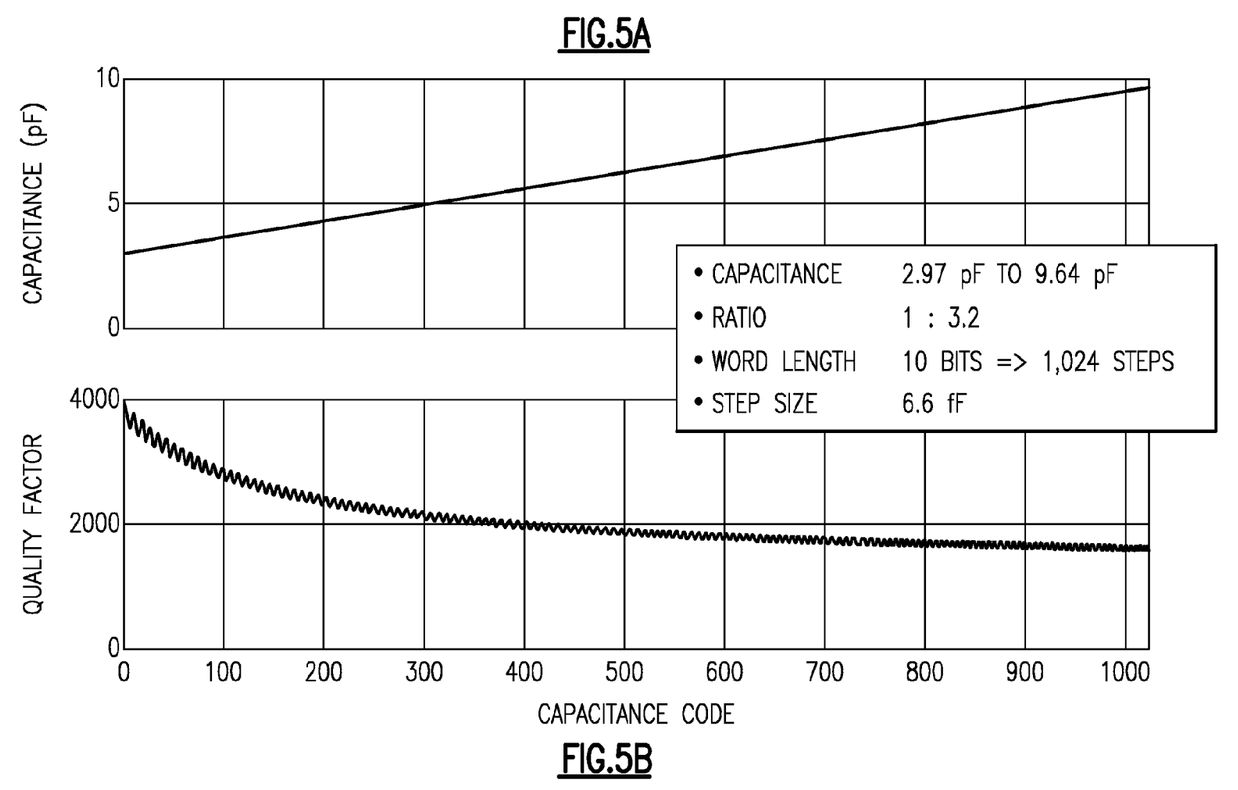
FIGS. 5A and 5B are capacitance and quality factor of the capacitor array of FIG. 4.

FIGS. 5A and 5B illustrate typical capacitance ranges and quality factor available from an vector capacitor array that was designed to provide selectable capacitance from 2.97 pF to 9.64 pF, with 10 bits of control input (e.g., N=9 and capacitance codes ranging from 0 to 1023) and a resulting step size of 6.6 pF. The curves were modeled assuming an input RF signal of 1 GHz.

Figure 6:
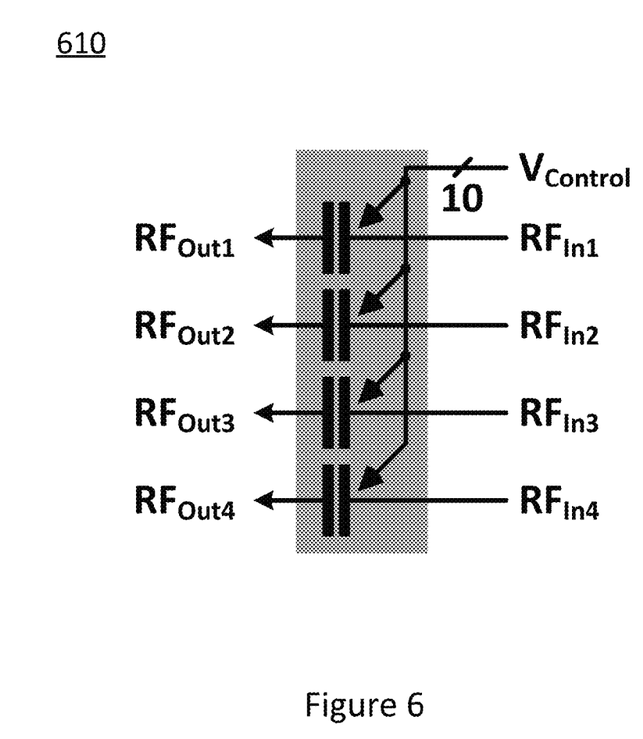
FIG. 6 is a high level block diagram of a semiconductor integrated circuit (IC) chip that includes four adjustable capacitor arrays.

FIG. 6 illustrates a high level block diagram of an integrated circuit (IC) 610 that combines four different vector capacitor arrays 400. Each array is provided with its own respective RF input (RFin1, RFin2, RFin3, RFin4) and RF output (RFout1, RFout2, RFout3, RFout4). The control inputs however can be fed in common to each of the arrays by $V_{control}$.

Figure 7:
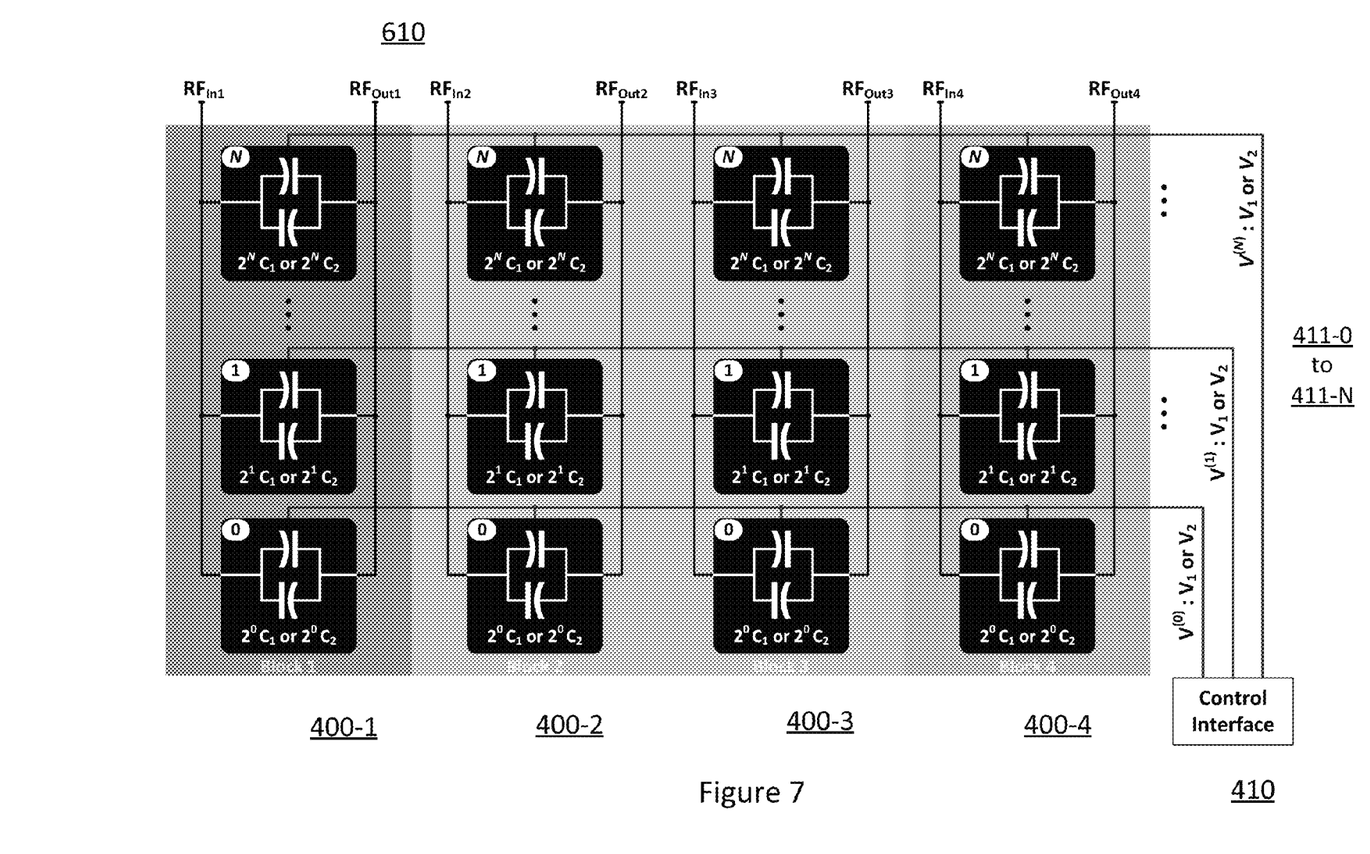
FIG. 7 is a more detailed diagram of the IC of FIG. 6.

FIG. 7 shows such an IC 610 in more detail. In this case the four arrays 400-1, 400-2, 400-3 and 400-4 are provided on the same chip substrate. The control voltages applied to the bias terminals in one array, e.g., 400-1, are the same as the control voltages applied to the other arrays 400-2, 400-3, and 400-4 from a common control interface 410.

In an application such as a smart phone this permits the different arrays to be used to implement different filters tuned to different radio frequency bands. As one example, these capacitor array constructions can be paired with fixed inductors to form tunable vector resonators, which can then be cascaded to form vector filters. The result can be a highly linear, compact, and programmable vector filter.

While various embodiments of the invention have now been particularly shown in the drawings and described in the text above, it will be understood by those skilled in the art that various changes in form and details may be made therein without departing from the scope of the invention. It is intended, therefore, that the invention be limited only by the claims that follow.

What is claimed is:

1. A variable capacitor apparatus comprising:
   a first terminal;
   a second terminal;
   a plurality of control word input terminals, for receiving a plurality of control input signals;
   a plurality of capacitance cells, each capacitance cell of the plurality of capacitance cells coupled between the first and second terminals, each capacitance cell of the plurality of capacitance cells comprising a pair of capacitor components, each capacitor component of the pair of capacitor components having an anode terminal and a cathode terminal and a bias voltage input terminal, the pair of capacitor components connected in anti-parallel, such that the anode terminal of a first capacitor component of the pair of capacitor components is connected to the cathode terminal of a second capacitor component of the pair of capacitor components, and the anode terminal of the second capacitor component is connected to the cathode terminal of the first capacitor component;
   a control circuit, coupled to the plurality of control word input terminals and to the bias voltage input terminals, for selectively controlling a plurality of bias voltages applied to the plurality of capacitance cells according to a state of the plurality of control input signals; and
   a plurality of capacitor arrays formed on a common semiconductor substrate, wherein the plurality of capacitor arrays comprises:
     a first capacitor array comprising the plurality of capacitance cells; and
     a second capacitor array comprising a plurality of capacitance cells each coupled between a third terminal and a fourth terminal, wherein the control circuit is further configured to bias the plurality of capacitance cells of the second capacitor array with the plurality of bias voltages.

2. The apparatus of claim 1 wherein each pair of the capacitor components comprises metal oxide semiconductor capacitors, and the control circuit biases the metal oxide semiconductor capacitors to either a first bias voltage or a second bias voltage.

3. The apparatus of claim 1 wherein each of the plurality of capacitance cells has a different capacitance size.

4. The apparatus of claim 3 wherein a first capacitance size of a first capacitance cell of the plurality of capacitance cells and a second capacitance size of a second capacitance cell of the plurality of capacitance cells differ by at least a factor of two.

5. The apparatus of claim 2 wherein the first bias voltage and the second bias voltage are located at opposing ends of a bias voltage operating range for the metal oxide semiconductor capacitors, wherein the first bias voltage is operable to bias the metal oxide semiconductor capacitors in an inversion mode, and wherein the second bias voltage is operable to bias the metal oxide semiconductor capacitors in an accumulation mode.

6. A method of providing variable capacitance, the method comprising:
   receiving a plurality of control input signals as an input to a control circuit;
   generating a plurality of bias voltages based on values of a plurality of control input signals using the control circuit;
   biasing a first plurality of capacitance cells of a first capacitor array using the plurality of bias voltages, wherein each of the first plurality of capacitance cells is coupled between a first radio frequency (RF) input terminal and a first RF output terminal, wherein a first capacitance cell of the first plurality of capacitance cells comprises a first metal oxide semiconductor (MOS) capacitor and a second MOS capacitor connected in an anti-parallel configuration, wherein an anode of the first MOS capacitor is connected to a cathode of the second MOS capacitor, and wherein a cathode of the first MOS capacitor is connected to an anode of the second MOS capacitor; and
   biasing a second plurality of capacitance cells of a second capacitor array using the plurality of bias voltages, wherein each of the second plurality of capacitance cells is coupled between a second RF input terminal and a second RF output terminal.

7. The method of claim 6 wherein generating the plurality of bias voltages comprises selectively controlling each of the plurality of bias voltages to one of two bias levels based on the values of the plurality of control input signals.

8. The method of claim 7 wherein biasing the first plurality of capacitance cells further comprises biasing the first capacitance cell of the first plurality of capacitance cells in an accumulation mode using a first bias voltage.

9. The method of claim 8 wherein biasing the first plurality of capacitance cells further comprises biasing a second capacitance cell of the first plurality of capacitance cells in an inversion mode using a second bias voltage.

10. The method of claim 6 wherein receiving the plurality of control input signals comprises receiving a multiple-bit digital control word.

11. The method of claim 6, wherein biasing the second plurality of capacitance cells of the second capacitor array using the plurality of bias voltages comprises biasing a pair of MOS capacitors connected in an anti-parallel configuration.

12. An integrated circuit comprising:
a first radio frequency (RF) input terminal;
a first radio frequency (RF) output terminal;
a first capacitor array comprising:
a first plurality of capacitance cells, wherein each of the first plurality of capacitance cells is coupled between the first RF input terminal and the first RF output terminal, wherein a first capacitance cell of the first plurality of capacitance cells comprises a first metal oxide semiconductor (MOS) capacitor and a second MOS capacitor connected in an anti-parallel configuration, wherein an anode of the first MOS capacitor is connected to a cathode of the second MOS capacitor, and wherein a cathode of the first MOS capacitor is connected to an anode of the second MOS capacitor;
a second capacitor array comprising a second plurality of capacitance cells, wherein each of the second plurality of capacitance cells is coupled between a second RF input terminal and a second RF output terminal; and
a control circuit configured to receive a plurality of control input signals and to bias the first plurality of capacitance cells of the first capacitor array with a plurality of bias voltages, wherein the control circuit is configured to selectively control the plurality of bias voltages based on values of the plurality of control input signals.

13. The integrated circuit of claim 12 wherein the control circuit is further configured to selectively control each of the plurality of bias voltages to one of two bias levels based on the values of the plurality of control input signals.

14. The integrated circuit of claim 13 wherein the two bias levels includes a first bias voltage level and a second bias voltage level, wherein the first bias voltage level is operative to bias the first MOS capacitor and the second MOS capacitor in an accumulation mode, and wherein the second bias voltage level is operative to bias the first MOS capacitor and the second MOS capacitor in an inversion mode.

15. The integrated circuit of claim 12 wherein the control circuit is further configured to bias the second plurality of capacitance cells of the second capacitor array with the plurality of bias voltages.

16. The integrated circuit of claim 12 wherein the plurality of control input signals comprises a multiple-bit digital control word.

17. The integrated circuit of claim 12 wherein the capacitance sizes of the cells of the first plurality of capacitance cells are different from one another.

18. The integrated circuit of claim 12 wherein a second capacitance cell of the second plurality of capacitance cells comprises a pair of MOS capacitors connected in an anti-parallel configuration.

19. The integrated circuit of claim 12 further comprising a third capacitor array comprising a third plurality of capacitance cells, wherein each of the third plurality of capacitance cells is coupled between a third RF input terminal and a third RF output terminal.

20. The integrated circuit of claim 19 wherein the control circuit is further configured to bias the second plurality of capacitance cells of the second capacitor array and the third plurality of capacitance cells of the third capacitor array with the plurality of bias voltages.

* * * * *